United States Patent
Masutani et al.

[11] Patent Number: 5,838,037
[45] Date of Patent: Nov. 17, 1998

[54] TFT-ARRAY AND MANUFACTURING METHOD THEREFOR

[75] Inventors: Yuichi Masutani; Yoshinori Numano; Kazuhiro Kobayashi, all of Tokyo, Japan

[73] Assignee: Mitsubishi Denki Kabushiki Kaisha, Tokyo, Japan

[21] Appl. No.: 858,693

[22] Filed: May 19, 1997

[30] Foreign Application Priority Data

Nov. 15, 1996  [JP]  Japan ................................ 8-304293

[51] Int. Cl.⁶ .................... H01L 27/108; H01L 27/01; H01L 27/12
[52] U.S. Cl. ................. 257/296; 257/57; 257/61; 257/66; 257/350
[58] Field of Search ................... 257/57, 61, 66, 257/296, 350

[56] References Cited

U.S. PATENT DOCUMENTS

| | | | |
|---|---|---|---|
| 5,528,055 | 6/1996 | Komori et al. | 257/66 |
| 5,648,663 | 7/1997 | Kitahara et al. | 257/59 |

FOREIGN PATENT DOCUMENTS

| | | |
|---|---|---|
| 7-128683 | 5/1995 | Japan . |
| 7-261152 | 10/1995 | Japan . |
| 7-261181 | 10/1995 | Japan . |
| 8-179368 | 7/1996 | Japan . |

OTHER PUBLICATIONS

K. Saigusa, et al., "Display Properties of a wide–viewing–angle in–plane–switching TFT–LCD", IPS/LCD, vol. 2, pp. 311–312.

*Primary Examiner*—Ngân V. Ngô
*Attorney, Agent, or Firm*—Oblon, Spivak, McClelland, Maier & Neustadt, P.C.

[57] ABSTRACT

A TFT-array including a substrate, a gate electrode, a first and second electrode provided on the substrate simultaneously with the gate electrode, an insulating film formed on the gate electrode, the first and the second electrode, a semiconductor layer formed on the gate electrode in such a manner that the insulating film is interposed between the semiconductor layer and the gate electrode, a pair of electrodes, either of which is connected with the first electrode or the second electrode, said pair of electrodes defining a semiconductor element together with the semiconductor layer.

6 Claims, 11 Drawing Sheets

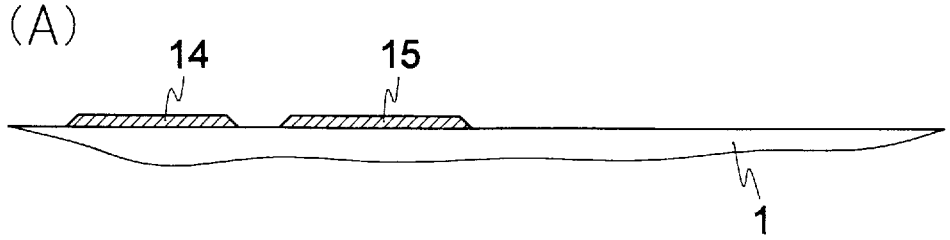
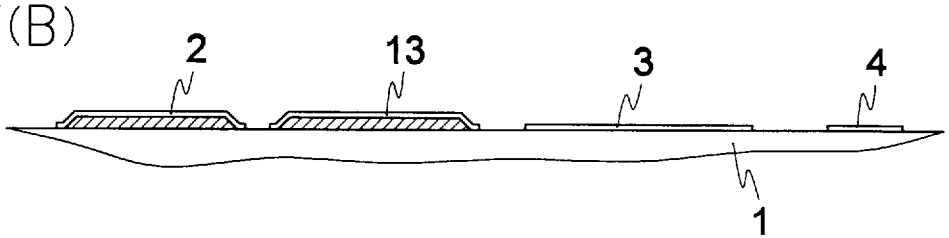
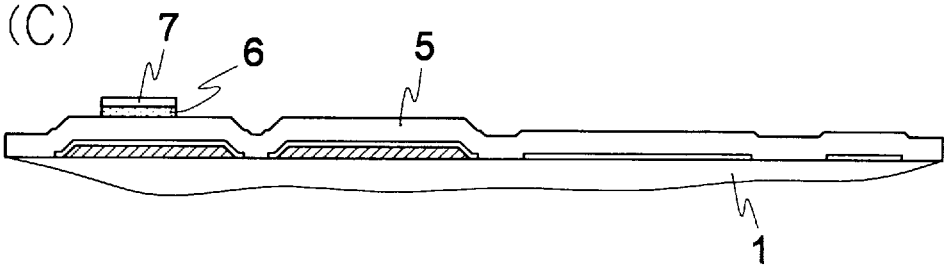
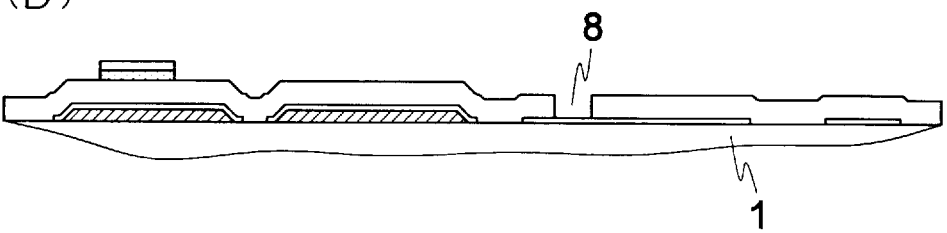
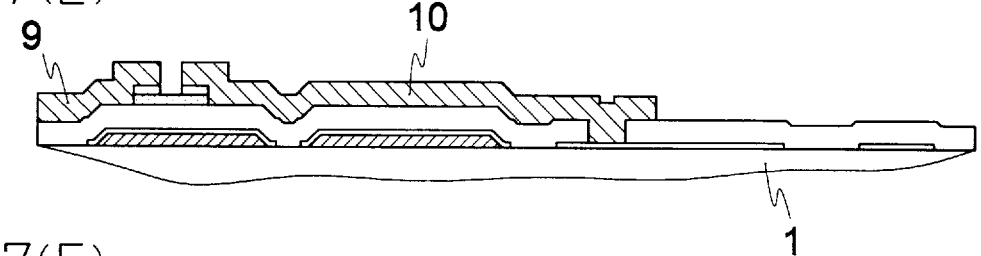
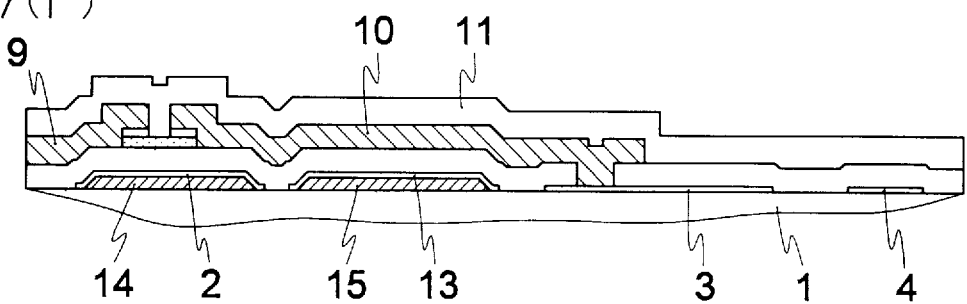

TFT-ARRAY AND MANUFACTURING METHOD THEREFOR

BACKGROUND OF THE INVENTION

The present invention relates generally to a thin film transistor-array (TFT-array) to be used in the liquid crystal display in, for example, active matrix type liquid crystal display and method of manufacturing the same, and a liquid crystal display provided with the same.

The conventional active matrix type liquid crystal display adopts a twisted nematic system for grasping the liquid crystal between two opposite transparent insulating substrates, each of the substrates having a transparent electrode being formed on the surface, and for applying the electric field to the liquid crystal in a direction vertical to the substrate to drive the liquid crystal for effecting the display.

FIG. 11 shows the sectional view of the liquid crystal panel of the active matrix type liquid crystal display adopting the conventional twisted nematic system. Referring to the drawing, reference numeral 1a is a transparent insulating substrate such as glass substrate or the like, reference numeral 2 is a gate electrode provided with gate line formed on the transparent insulating substrate 1a, reference numeral 5 is a gate insulating film, reference numeral 6 is an amorphous silicon formed on the gate electrode 2 through the gate insulating film 5, reference numeral 7 is an amorphous silicon, with impurities such as phosphorus or the like doped into it, formed on the amorphous silicon 6, reference numerals 9 and 10 are a source line and a drain electrode, with a source electrode for composing the semiconductor element together with the amorphous silicon 6, formed on the amorphous silicon 7 with impurities being doped into it, reference numeral 11 is a passivation film composed of transparent insulating film such as silicon nitride, silicon oxide or the like, reference numeral 26 is a pixel electrode electively connected with the drain electrode, reference numeral 19 is an alignment film. A TFT substrate 20 is composed of the above described elements. Also, reference numeral 23 is an opposite substrate with a black matrix 21, an overcoat layer 22 and an counter electrode 27 formed on the transparent insulating substrate 1a. Reference numeral 24 is a liquid crystal, and reference numeral 25 is a light polarizing plate. In the liquid display adopting the twisted nematic system, the electric field, vertical in direction to the transparent insulating substrate 1a face, is applied to the liquid crystal 24 grasped between the TFT substrate 20 and the opposite substrate 23.

But the liquid crystal display adopting the twisted nematic system has problems on the displaying in that the contrast is considerably lowered when the visual angle direction has been changed, and the gradation level has been inverted when the multi-gradation has been displayed.

In the liquid crystal displaying apparatus of active matrix type, a system of making the direction of the electric field to be applied to the liquid crystal parallel in direction to the substrate face. For example, Asia Display '95, pp. 577 to 580 by Mr. Ohta and others show that the contrast is hardly lowered when the visual angle direction has been varied, and the gradation level has been hardly inverted when the multi-gradation display has been effected in accordance with the system adopted.

A method of forming two electrodes with two types of layers of the source drain line layer and the gate electrode layer, shown by Asia Display '95, pp. 707 to 710 by Mr. Ohta and others, and a method of forming two electrodes together with the use of the source drain wiring layer, disclosed in Japanese Unexamined Patent Publication No. 128683/1995, are proposed as the method of forming two electrodes to be formed on the thin film transistor integrating apparatus for applying the electric field to the liquid crystal in a direction parallel to the substrate face.

A system for applying the electric field upon the liquid crystal in a direction parallel to the substrate face requires the electric field strong for driving the liquid crystal. When the voltage of, for example, 5 V is applied on the electrode, the electric field strong enough to drive the liquid crystal fully is obtained only when the electrode spacing is made approximately 4 $\mu$m through 6 $\mu$m. Also, when dispersion is caused in the space between the electrode for forming the electric field, dispersion is caused in the brightness on the display of the liquid crystal display by changing in the strength of the electric field to cause the uneven display, and further the variation amount of the strength of the electric field to the change amount of the electrode spacing becomes larger as the electrode spacing becomes narrower, thus increasing the dispersion in the brightness on the display.

Some methods are not effective which have been conventionally proposed as a method of forming two electrodes for forming the electrode field in a direction parallel to the substrate face. For example, a method of forming two electrodes with different layers had problems in that it was difficult to form with good precision the electrode interval of few micro meters level because of the alignment error between the layers, or the boundary of the divided exposure portion was visually recognized, because the shift amount of alignment error between the layers was different for each divided region in the formation of the liquid crystal display panel by the divided exposure.

Also, in a method of forming with the source drain line layer together with two electrodes, there is required thickness sufficient enough to cover the difference between the layers, because the source drain line was formed on the uneven face due to the gate electrode or the like formed in the lower layer although a problem to be caused due to shift of the alignment error between the layers was not caused. Thus, it was difficult to form with precise the electrode interval of few micro meters level, because the thickness of the two electrodes to be formed at the same time became thicker and the patterning of the high precision was hard to effect. Also, a problem in that the panel aperture ratio for determining the brightness of the display of the liquid crystal displaying apparatus was not obtained was caused because it was difficult to form the width of the electrode narrower.

Accordingly, an object of the present invention is to provide a TFT-array which is equal within the substrate in the strength of the electric field in a direction parallel to the substrate face and is small in the area of the line and the electrode portion by formation of the electrode with high precision for forming electric field in the direction parallel to the substrate face.

Also, another object of the present invention to provide a liquid crystal display which is hardly lowered in contrast when the visual angle direction has been changed and is hardly inverted in the gradation level in the multi-gradation displaying, and is even in display and higher in aperture ratio by adoption of a system for making the direction of the electric field to be applied upon the liquid crystal parallel to the substrate face by the mounting of the TFT-array which is equal within the substrate in the strength of the electric field in a direction parallel to the substrate face, and is small in wiring and the electrode portion.

SUMMARY OF THE INVENTION

The TFT-array of the present invention comprises a substrate, a gate electrode, a first and second electrode provided on the substrate simultaneously with the gate electrode, an insulating film formed on the gate electrode, the first and the second electrode, a semiconductor layer formed on the gate electrode in such a manner that the insulating film is interposed between the semiconductor layer and the gate electrode, a pair of electrodes, either of which is connected with the first electrode or the second electrode, said pair of electrodes defining a semiconductor element together with the semiconductor layer.

It is preferable that the first electrode and the second electrode are arranged so that they are comb-shaped respectively and are opposed to each other.

Also, a common line for forming a storage capacitance is formed on the gate electrode side, and another common line for applying the voltage upon the first electrode or the second electrode is formed on the opposite side with the regions forming the electric field in a direction parallel to the substrate being grasped.

It is preferable that the common line for forming the storage capacitance and another common line for applying the voltage upon the first electrode or the second electrode is electrically connected to at least one first electrode or second electrode.

It is preferable that the low resisting material is connected with at least either of the line for applying the voltage upon the gate electrode, the first electrode or the second electrode or the common line for forming the storage capacitance.

It is preferable that all the insulating film or part of it is removed which is formed on the region for forming the electric field in the direction parallel to the substrate face.

In accordance with the present invention, there is also provided a method of manufacturing a TFT-array including steps of:

simultaneously forming the gate electrode, the first electrode and the second electrode, with the same material, on the substrate, forming the gate insulating film on the gate electrode, the first electrode and the second electrode, forming a semiconductor layer through the insulating film on the gate electrode, and forming a pair of electrodes for composing semiconductor element together with the semiconductor layer.

Also, the common line for forming a storage capacitance is formed simultaneously with the same material as those of the gate electrode, the first electrode and the second electrode.

Also, a step is included of coating the low resisting member on at least either of the wiring for applying the voltage upon the gate electrode, the first electrode or second electrode, and the line for forming the storage capacitance.

Also, the liquid crystal display of the present invention is provided with a transparent insulating substrate, a TFT-array of the above construction formed on the transparent insulating substrate, an opposite substrate for grasping the liquid crystal material together with the transparent insulating substrate.

BRIEF DESCRIPTION OF THE DRAWINGS

FIGS. 7(A) to 7(F) are each sectional view showing the step of manufacturing the portion along a line of B—B of FIG. 6;

DETAILED DESCRIPTION

Embodiment 1

Figure 1:
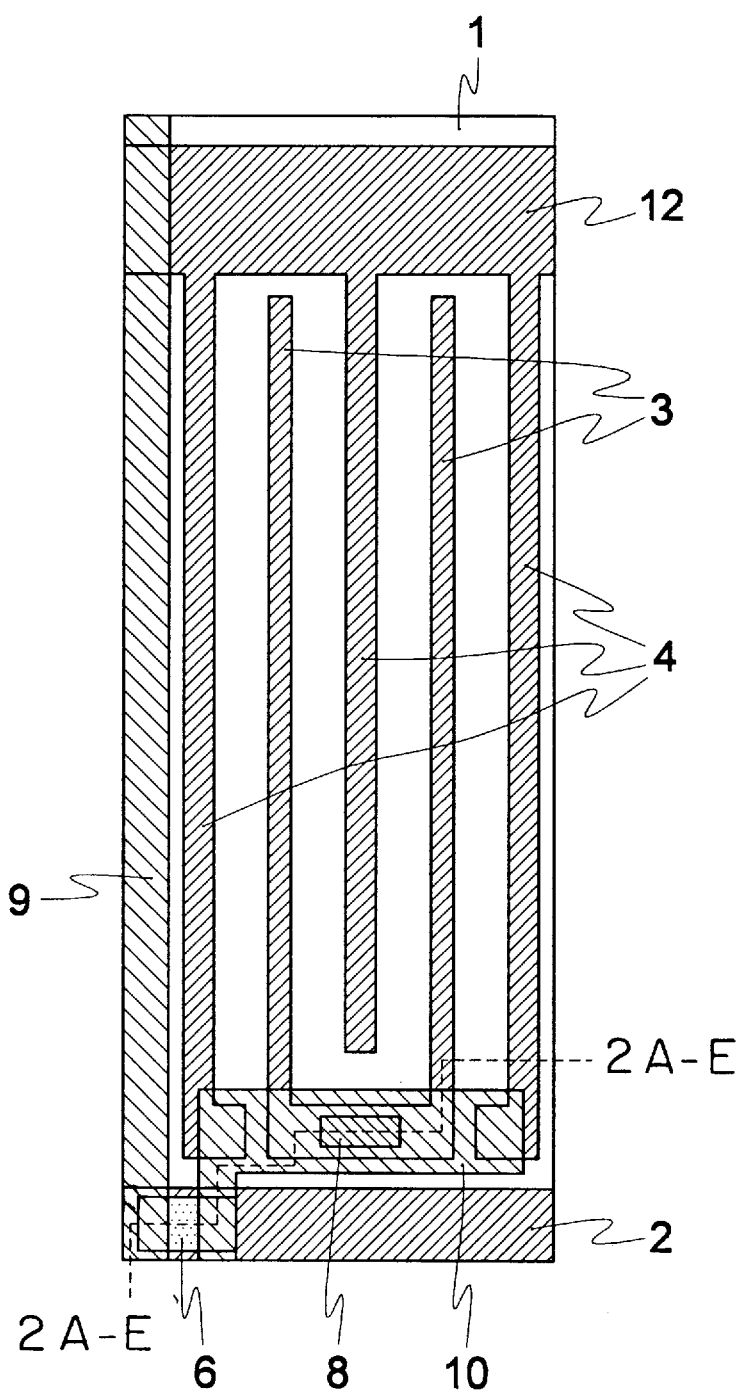
FIG. 1 is a plan view showing one pixel element of the TFT-array of the invention.

TFT-array in one embodiment of the present invention, and a liquid crystal display with the same mounted on it will be described hereinafter. FIG. 1 is a plan view showing one pixel element of the TFT-array of the present invention. FIG. 2 is a sectional view showing the manufacturing step of portions taken along a line of A—A of FIG. 1. Referring to the drawings, reference numeral 1 is a substrate. Reference numeral 2 is a gate electrode provided with gate line formed on the substrate 1. Reference numerals 3 and 4 are a pixel electrode and an counter electrode for forming the electric field in a direction parallel to the substrate 1 face, formed simultaneously with the gate electrode 2, on the substrate 1, each having comb-shaped, and being arranged to oppose each face. Reference numeral 5 is a gate insulating film formed on the entire face on the gate electrode 2, the pixel electrode 3 and the opposite electrode 4. Reference numeral 6 is an amorphous silicon formed on the gate electrode 2 through the gate insulating film 5. Reference numeral 7 is an amorphous silicon, with impurities such as phosphorus or the like doped into it, formed on the amorphous silicon 6. Reference numeral 8 is a contact hole formed in the gate insulating film 5 on the drain side electrode 3. Reference numerals 9 and 10 are the source line and drain electrode formed on the amorphous silicon with impurities doped into it with the drain electrode 10 being electrically connected with the pixel electrode 3 formed through the contact hole 8.

Reference numeral 11 is a passivation film composed of transparent insulating film such as silicon nitride, silicon oxide or the like. Reference numeral 12 is common line for applying the voltage upon the opposite electrode 4, which is formed on the side opposite to the gate electrode 2 with the region where the electric field is formed being grasped. Also, the storage capacitance for retaining the voltage by the pixel electrode 3 and the counter electrode 4 is formed by the superposition between the end portion of the electrode on both the ends within one picture element of the opposite electrode 4 having the comb-shape and the drain electrode 10. The TFT-array is formed so that the picture elements composed of the above described elements are arranged in matrix shape.

Figure 2A:
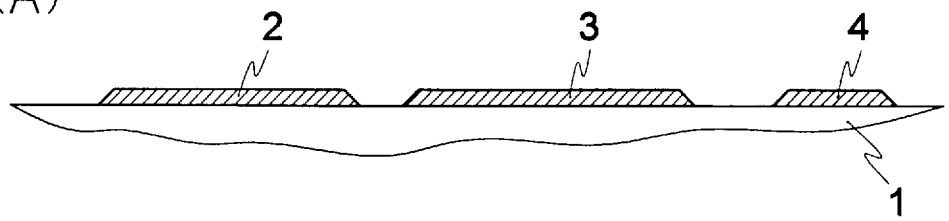
FIG. 2(A) to 2(E) are each sectional view showing the manufacturing step of portions taken along a line of A—A of FIG. 1.

The method of manufacturing the TFT-array in the present embodiment will be described hereinafter. At first, as shown in FIG. 2(A), the gate electrode 2, and the pixel electrode 3 and the counter electrode 4 for forming the electric field in a direction parallel to the substrate 1 face are formed, on the substrate 1, of film as thick as approximately 0.03 μm through 0.6 μm with the use of either of the single layer film composed of either of Cr, Al, Mo, Ta, Cu, Ti, W, Al—Cu, or alloy among them, or transparent conductive material such as ITO or the like, or multi-layer film laminated with them. An etching method wherein the patterns section becomes rectangular may be also used although the taper etching method where the pattern section becomes trapezoidal was used as an etching method of pattern-forming at the same time the gate electrode 2, the pixel electrode 3, and the counter electrode 4.

Figure 2B:
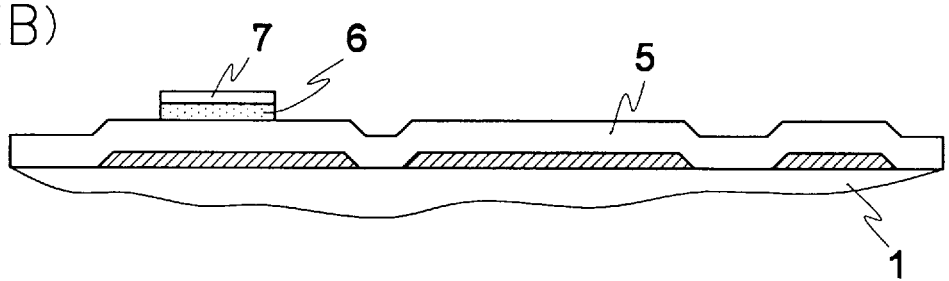

As shown in FIG. 2(B), the gate insulting film 5, the amorphous silicon 6 and the amorphous silicon 7 with impurities being doped into it are deposited successively, and the amorphous silicon 6 and the amorphous silicon 7 with impurities doped being into it are etched at the same time with the use of the etching resist formed by the photo-lithography so as to form in the position above the gate electrode 2 the pattern of the amorphous silicon 6 and the amorphous silicon 7 with impurities being doped into it. The gate insulating film 5 is formed with the use of either of the silicon nitride and silicon oxide, film oxide of the gate electrode 2 material, or multi-layer film laminated with them. Also, micro-crystal silicon or the like with impurities such as phosphorus being doped into it may be also used, instead of amorphous silicon 7 with impurities being doped into it.

Figure 2C:
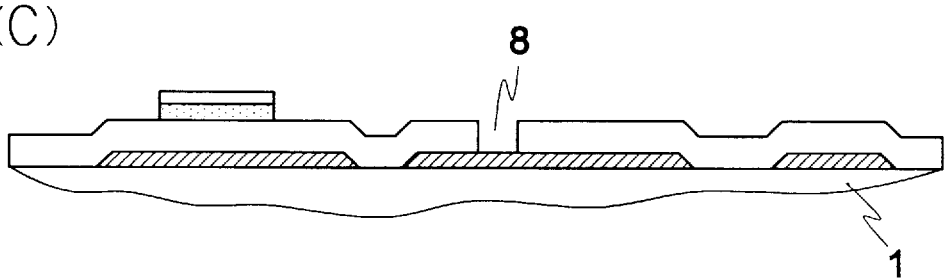
Figure 2D:
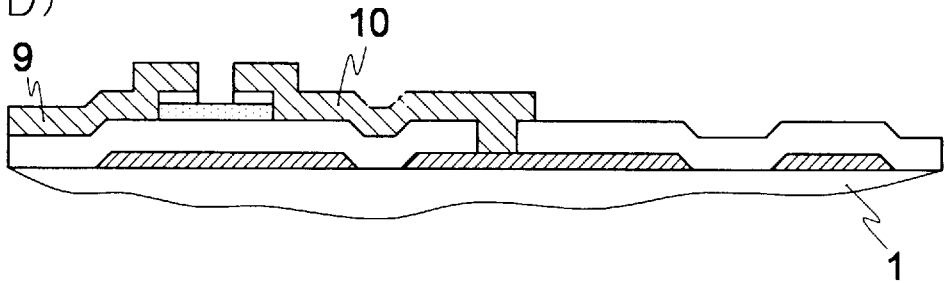
Figure 2E:
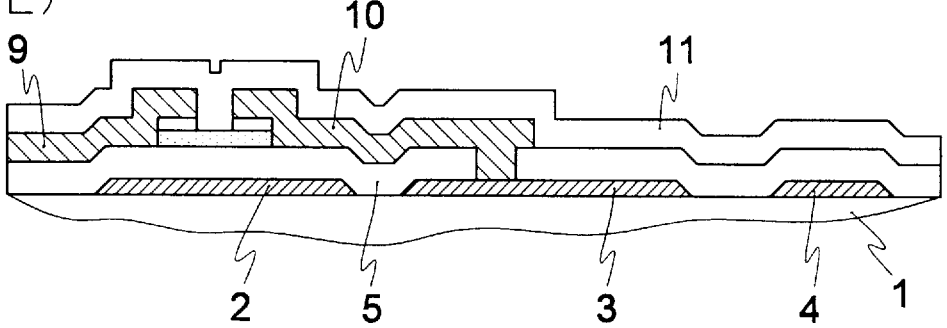

As shown in FIG. 2(C), a contact hole 8 is formed in the gate insulating film 5 on the pixel electrode 3. Then, the either of the single layer film composed of either of Cr, Al, Mo, Ta, Cu, Ti, W, Al—Cu, Al—Si—Cu or alloy among them, or transparent conductive material such as ITO or the like, or the either of multi-layer film laminated with them is filmed as shown in FIG. 2(D) so as to form the source line 9 and the drain electrode 10, by the patterning, which are divided into two in such a manner as to be spaced with each other on the pattern of the amorphous silicon 7 with impurities being doped into it. At this time, the drain electrode 10 is electrically connected with the pixel electrode 3 through the contact hole 8. Thereafter, the amorphous silicon 7 with impurities being doped into it is removed in etching with the portion covered by the source wiring 9 and the drain electrode 10 remaining. Finally, transparent insulating film such as silicon nitride or silicon oxide or the like is formed on the entire face as the passivation film 11 as shown in FIG. 2 (E). By the above described steps, the TFT-array can be formed which has the pixel electrode 3 and the counter electrode 4, on he substrate 1, for causing the electric field in the direction parallel to the substrate 1 face.

A TFT-array may be also formed in connection with the method of forming the channel-passivation tin film transistor, with the passivation film (channel passivation film) of silicon nitride or the like on the amorphous silicon 6 (channel portion) being interposed, instead of the channel-etched thin film transistor, although the present embodiment shows a case where the method of forming the thin film transistor integrating apparatus for forming the electrode for forming the electric field in the direction parallel to the substrate 1 face simultaneously with the gate electrode 2 is combined with the method of forming the channel etching type thin film transistor.

According to the present invention, a TFT-array can be formed, which is equal within the substrate 1 in the strength of the electric field in a direction parallel to the substrate 1 face and is small in the area of the electrode portion of the electric field forming region. This is because the precision of the interval value between the electrodes is not reduced due to the shift between the uneven lower layer and the superposition between the layers, because the pixel electrode and the counter electrode 4 for forming the electric field in the direction parallel to the substrate 1 face are formed simultaneously on the substrate 1 or finer formation can be made with the thinner film of the pixel electrode 3 and the counter electrode 4, because the electrodes are formed on the flat substrate 1.

Embodiment 2

Figure 3:
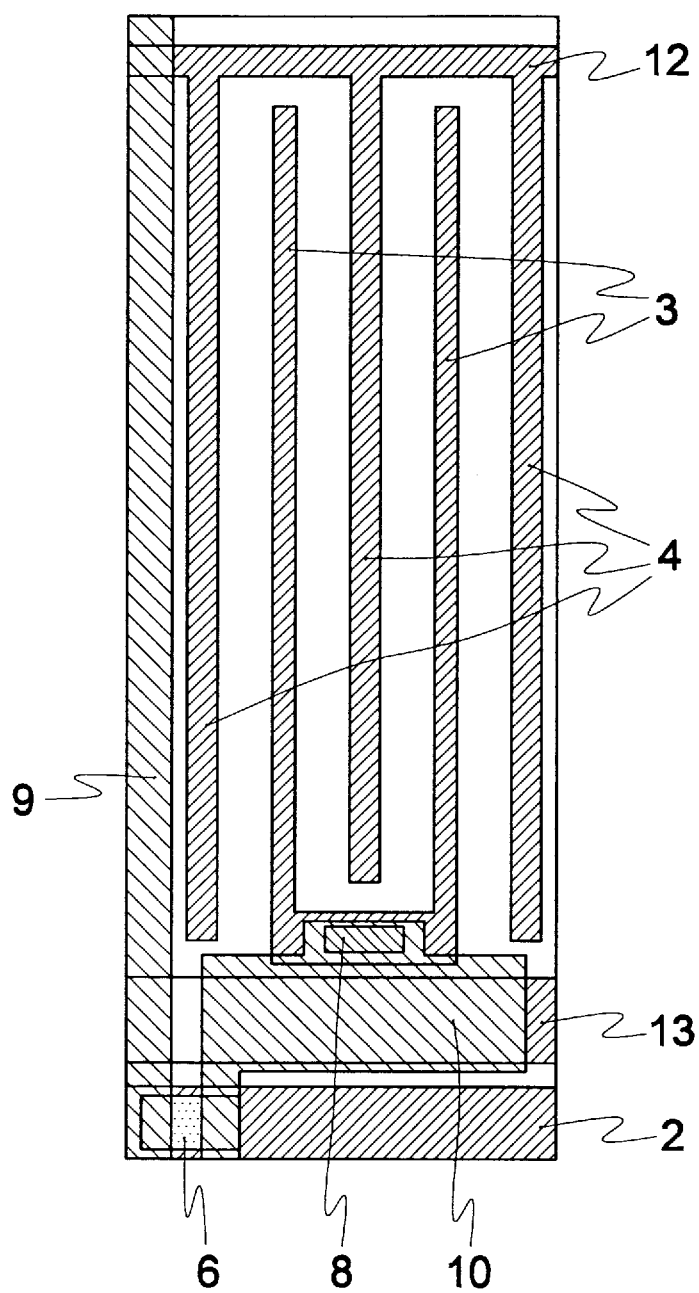
FIG. 3 is a plan view of one pixel element portion of the TFT-array showing one embodiment of the invention.
Figure 4:
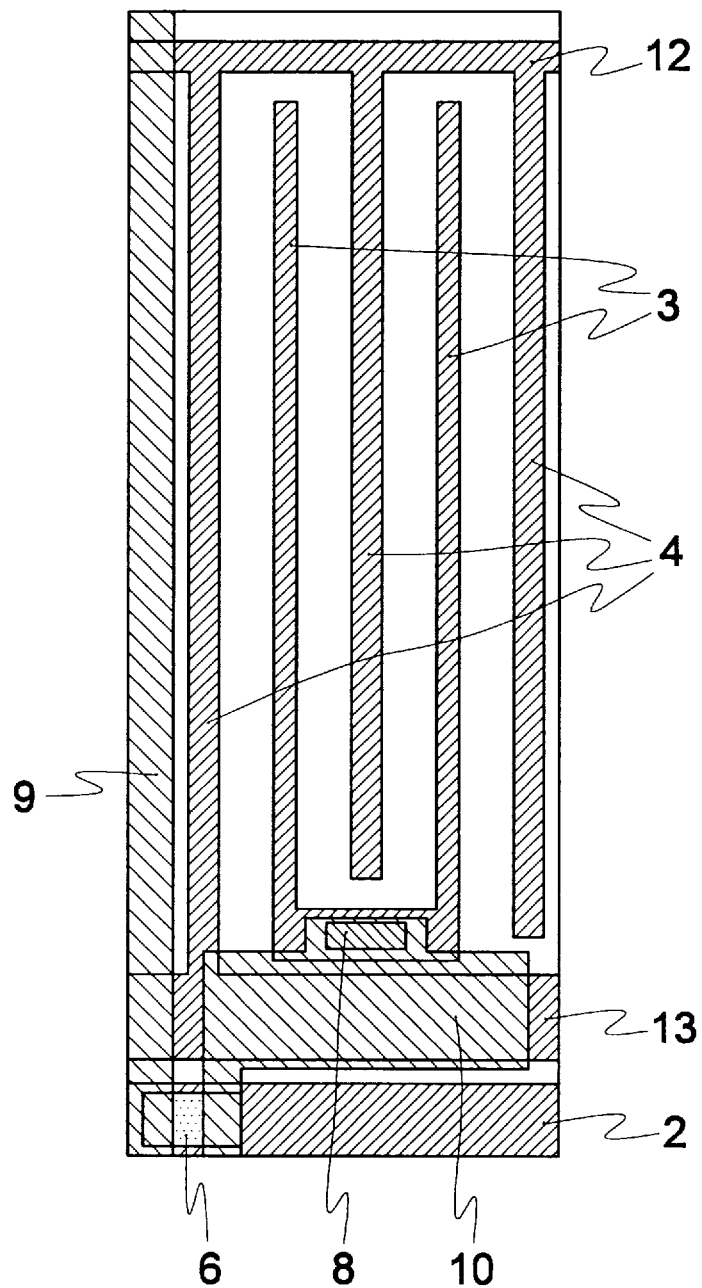
FIG. 4 is a plan view of one pixel element portion of the TFT-array showing another embodiment of the invention.

FIG. 3 is a plan view of one pixel element portion of the TFT-array showing Embodiment 2 of the present invention. Referring to the drawing, reference numeral 13 is an electric field voltage formed by the pixel electrode 3 and the counter electrode 4, common line for forming the storage capacitance for retaining the voltage to be applied upon the liquid crystal in the liquid crystal display, which are formed on the substrate 1 simultaneously with the gate electrode 2. The same parts as those in FIG. 1 are designated with the same reference numerals in FIG. 3 with no description of the same parts being given. Also, as the method of manufacturing the TFT-array in the present embodiment is the same as in Embodiment 1, the description thereof will be omitted.

In Embodiment 1, the pattern of the end portion of the counter electrode 4 was necessary to be made larger due to increase the storage capacitance, because the storage capacitance was formed by the superposition between the end portion of the counter electrode 4 and the drain electrode 10. Or the counter electrode 4 could not make the line width narrower, because the load to be applied upon the line 12 for applying the voltage upon the counter electrode 4 was large due to the formation of the storage capacitance in the counter electrode 4.

The present embodiment allows the pixel electrode 3, the drain electrode 10 of a portion connected with the thin film transistor portion to be superposed through the contact hole 8 on the common line 13 and sufficient storage capacitance to be easily formed by the formation of the common line 13 for forming the storage capacitance on the side same as that of the gate electrode 2 with respect to the region where the electric field is formed and between the gate electrode 2 and the pixel electrode 3. Also, in the counter electrode 4, the load to be applied upon the line 12 for applying the voltage upon the counter electrode 4 becomes small because of no storage capacitance formed. The width of the line 12 can be made narrower. In the liquid crystal display, the aperture ratio for determining the brightness of the display can be increased. In the present embodiment, sufficient storage capacitance can be easily obtained.

Embodiment 3

Although the common line 13 for forming the storage capacitance is provided independently in Embodiment 2, the line defect is not caused because of the connection with the counter electrode 4 by the electric connection of the common line 13 with one line shaped electrode within the counter electrode 4 having the comb-shape even when either of the common line 13 or line 12 for applying the voltage upon the counter electrode 4 is disconnected. The counter electrode 4 to be connected with the common line 13 may be plural.

Figure 5:
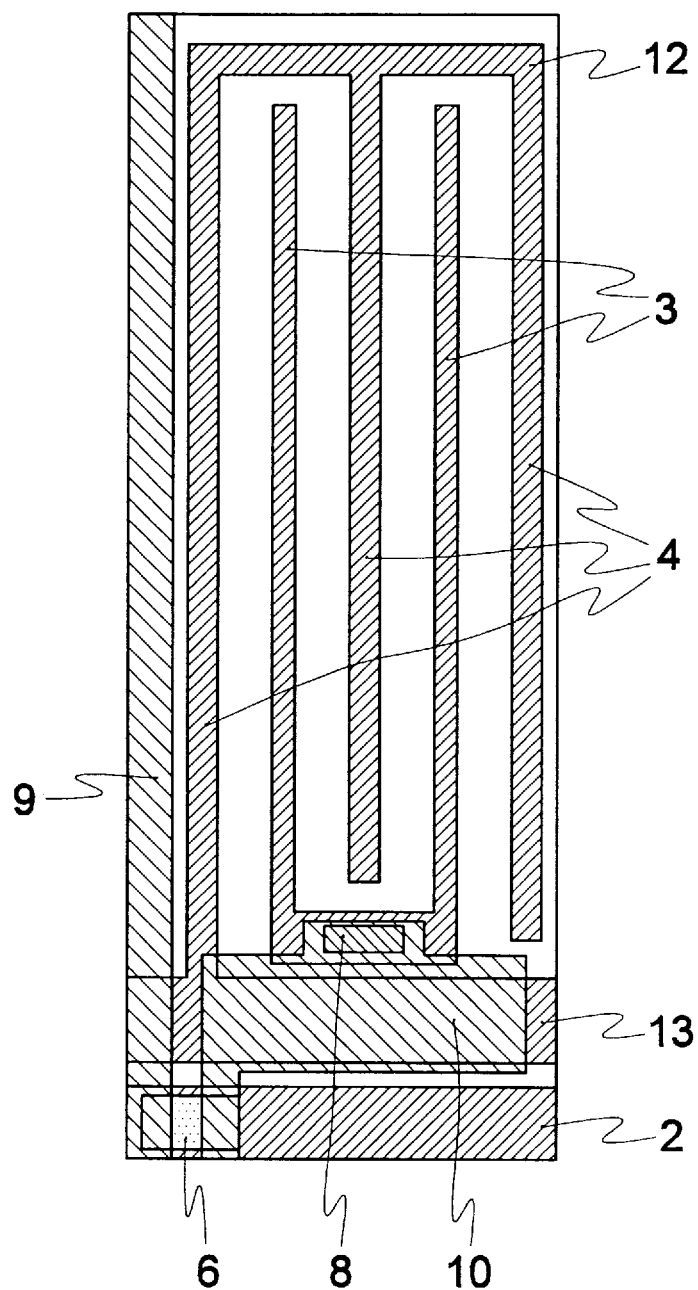
FIG. 5 is a plan view of one pixel element portion of the TFT-array showing still another embodiment of the invention.

Also, as shown in FIG. 5, the line 12 for applying the voltage upon the counter electrode 4 is not necessary to be connected with the line 12 of the adjacent pixel element with the electric connection of the common line 13 with at least one line shaped electrode within the counter electrode 4 having the comb shape.

According to the present embodiment, the crossing portion between the line 12 and the source line 9 can be reduced and the disconnection and the short between layers due to the difference of the lower layer, thereby improving the yield, because the diffuse property of the line is increased due to the connection between the common line 13 and the line 12 for applying the voltage upon the counter electrode 4 or the line 12 for applying the voltage upon the counter electrode 4 is not connected with the line 12 of the adjacent pixel element.

Embodiment 4

Figure 6:
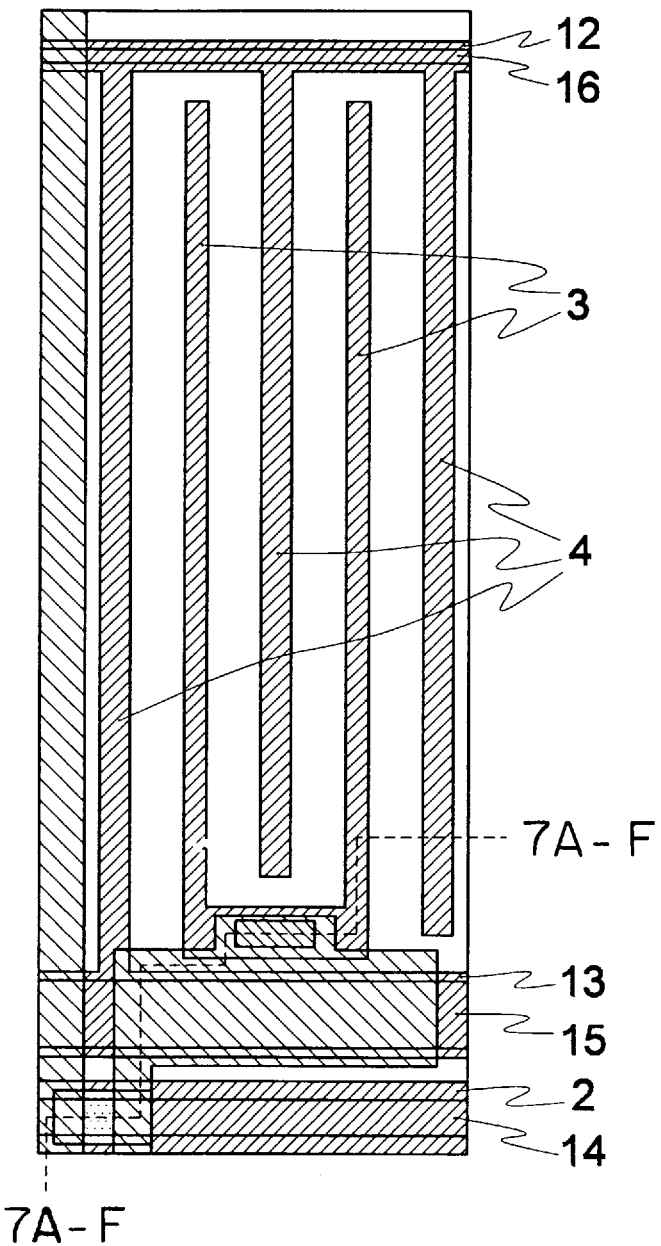
FIG. 6 is a plan view of one pixel element portion of the TFT-array showing yet another embodiment of the invention.

FIG. 6 is a plan view of one pixel element portion of the TFT-array showing Embodiment 4 of the present invention. FIG. 7 is a sectional view showing the step of manufacturing the portion along a line of B—B of FIG. 6. In the drawing, reference numeral 14 is a line for making the gate electrode 2 lower in resistance, reference numeral 15 is line for making the common line 13 lower in resistance, reference numeral 16 is a line for making the line 12 lower in resistance which applies the voltage upon the counter electrode 4, with the line 14, 15 and 16 being formed simultaneously on the substrate 1. The same parts shown in FIG. 3 are designated with the same reference numerals in FIG. 6 with no description thereof being given.

A method of manufacturing the TFT-array in the present Embodiment will be described hereinafter. At first, the single layer film composed of either of Cr, Al, Mo, Ta, Cu, Ti, W, Al—Cu and Al—Si—Cu, and alloy among them, and transparent conductive material such as ITO or the like, or either of multi-layer films laminated with them is used to film at the same time as shown in FIG. 7(A) so as to form the line 14 for making the gate electrode 2 lower in resistance, line 15 for making the common line 13 lower in resistance, the line 16 (not shown) for making the line 12 lower in resistance for applying the voltage upon the counter electrode 4. An etching method where the pattern section becomes rectangular may be also used although the taper etching method where the pattern section becomes trapezoidal is used as an etching method in the simultaneous pattern-forming of the lines 14, 15 and 16.

Then, the gate electrode 2, the common line 13, the line 12 (not shown) for applying the voltage upon the counter electrode 4, the pixel electrode 3 and the counter electrode 4 for forming the electric field in a direction parallel to the substrate 1 face are formed simultaneously with the use of the single layer film composed of either of Cr, Al, Mo, Ta, Cu, Ti, W, Al—Cu, and Al—Si—Cu, and alloy among them, and transparent conductive material such as ITO or the like, or either of multi-layer films laminated with them is filmed as shown in FIG. 7(B) in shape so that the gate electrode 2 includes line 14 for making the gate electrode 2 lower in resistance, the common line 13 includes the line 15 for making the common line 13 lower in resistance, the line 12 for applying the voltage upon the counter electrode 4 includes line 16 for making the line 12 lower in resistance. The film of the layer is made as thin as possible so that the pixel electrode 3 and the counter electrode 4 may be formed in pattern with high precision. Also, the taper etching method may be also used, although the etching method of making the pattern end portion vertical is used as an etching method in the pattern formation.

Then, as shown in FIG. 7(C), the pattern of the amorphous silicon 6 and the amorphous silicon 7 with impurities being doped into it are formed in the position above the gate electrode 2 by successive deposition of the gate insulating film 5, the amorphous silicon 6 and the amorphous silicon 7 with impurities doped into it, and simultaneous etching of the amorphous silicon 6 and the amorphous silicon 7 with impurities being doped into it with the use of the etching resist formed by the photo-lithography. The gate insulating film 5 is made as thick as approximately 0.1 μm through 1.0 μm with the use of either of silicon nitride and silicon oxide, and the film oxide of the material of the gate electrode 2 and multi-layer film laminated with them. Also, micro-crystal silicon or the like with impurities such as phosphorus or the like may be also used, instead of amorphous silicon 7 with impurities doped into it.

As shown in FIG. 7(D), the contact hole 8 is formed in the gate insulating film 5 on the pixel electrode 3. The single layer film composed of either of Cr, Al, Mo, Ta, Cu, Ti, W, Al—Cu and Al—Si—Cu, and alloy among them, and transparent conductive material such as ITO or the like, or either of multi-layer film laminated with them is filmed as thick as approximately 0.1 μm through 1.0 as shown in FIG. 7(E) so as to form the source line 9 and the drain electrode 10 which are divided into two in such a manner as to be spaced with each other on the pattern of the amorphous silicon 7 with impurities doped into to it by the patterning. At this time, the drain electrode 10 is electrically connected with the drain side electrode 3 through the contact hole 8. Thereafter, the amorphous silicon 7 with impurities doped into it is removed with the portion covered with the source line 9 and the drain electrode 10 remaining. Finally, as shown FIG. 7(F), the transparent insulating film such as silicon nitride, silicon oxide or the like is formed on the entire face as a passivation film 11.

In the present embodiment, the TFT-array in connection with the channel-passivated thin film transistor forming method, instead of the channel etch type thin film transistor although the embodiment shows the combination between a TFT-array forming method for forming simultaneously with the gate electrode 2 the electrode forming the electric field in the direction parallel to the substrate 1 face and the channel etch type thin film transistor forming method.

The same effect is obtained by the formation of the gate electrode 2, the line 12 for applying the voltage on the counter electrode 4, and the line low in resistance in the lower layer of the common line 13 as even in the construction of the TFT-array in Embodiment 1 or Embodiment 2 although in the present embodiment is explained with the construction of the TFT-array of the Embodiment 3.

According to the present embodiment, the pattern width of the line portion where low resistance is necessary can be made smaller in a condition where the pixel electrode 3 and the counter electrode 4 for forming the electrode field in a direction parallel to the substrate 1 face where the high-precision and fine pattern formation is required, because the line low in resistance can be formed by the use of the low resistance material and the thicker film only in the line portion where the line resistance is necessary to be made smaller.

Embodiment 5

Figure 8:
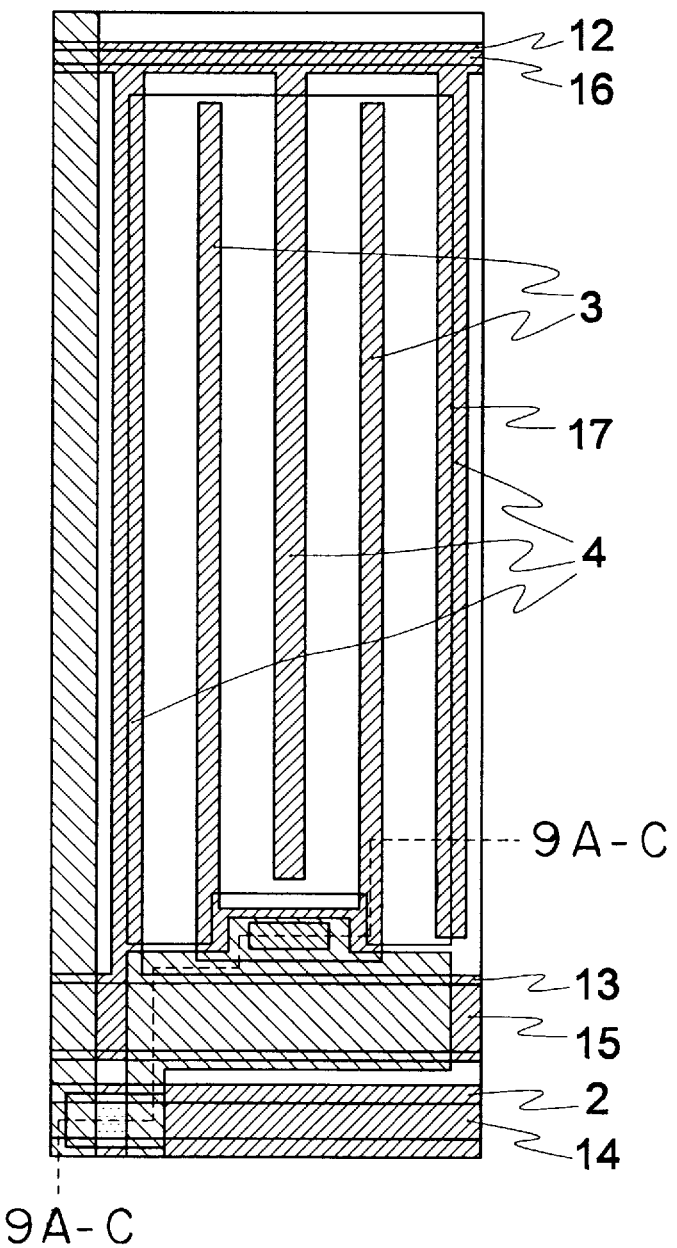
FIG. 8 is a plan view of one pixel element of the TFT-array showing one embodiment of the invention.

FIG. 8 is a plan view of one pixel element of the TFT-array showing Embodiment 5 of the invention. FIG. 9 is a sectional view of a portion taken along a line of C—C of FIG. 8. Referring to the drawing, reference numeral 17 is a removing portions of the gate insulating film 5 and the passivation film 11 in a region where an electric field is formed in the direction parallel to the substrate 1 face with respect to the pixel electrode 3 comb-shaped, and the counter electrode 4 opposite to each other. The same parts in FIG. 8 are designated by the same reference numerals in FIG. 6 with no description of the same parts being given. As the method of manufacturing the TFT-array in the present embodiment is the same as those in Embodiment 4, the description thereof is omitted.

The driving voltage for strengthening the electric field is required to be raised or the space between the drain side electrode 3 and the counter electrode 4 is required to be narrowed so that much higher precise pattern formation is required, because the strength of the electric field to be formed by the pixel electrode 3 and the counter electrode 4 is damaged by the formation of the gate insulating film 5 and the passivation film 11 on the pixel electrode 3 and the counter electrode 4 for forming the electric field. In the TFT-array in the present embodiment, the strength of the electric field is prevented from being damaged by the removing of the gate insulating film 5 and the passivation film 11 on the drain side electrode 3 and the counter electrode 4 for forming the electric field.

Figure 9A:
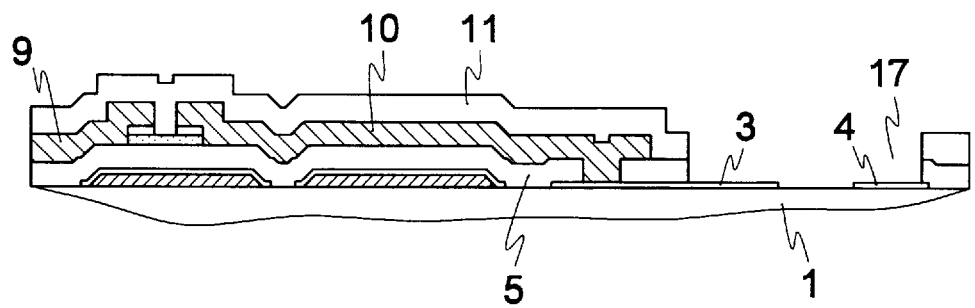
FIGS. 9(A) to 9(C) are each sectional view of a portion taken along a line of C—C of FIG. 8.
Figure 9B:
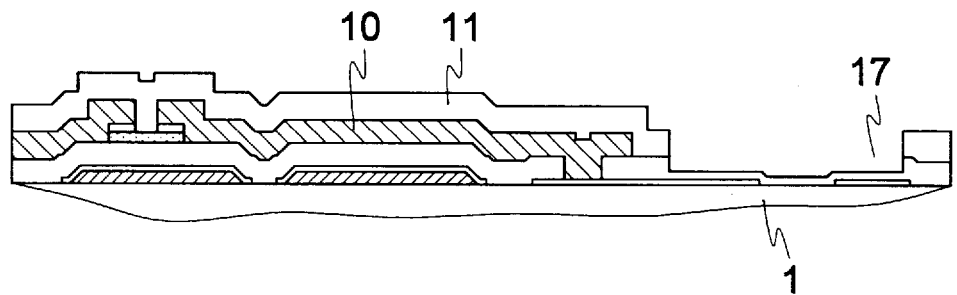
Figure 9C:
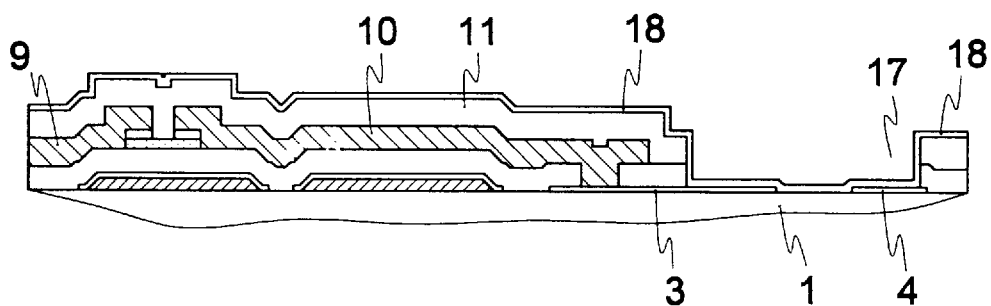

The TFR-array in the embodiment is etching removed in the gate insulating film 5 and the passivation film of the removing portion 17 which is the region where the electric field is formed after the formation of the passivation film 11 in the TFT-array formed as in the Embodiments 1, 2, 3 and 4. There are a method of removing all the gate insulating film 5 and the passivation film 11 as shown in FIG. 9(A), a method of removing with one portion of the gate insulating film 5 remaining after the removing of the passivation film 11 as shown in FIG. 9(B), a method of forming passivation film 18 thinner after the removing of the gage insulating film 5 and the passivation film 11 as shown in FIG. 9(C), as the construction of the removing portion 17.

The present embodiment can form the electrode field efficiently with the same driving voltage and without narrowing the space between the pixel electrode 3 and the counter electrode 4, because the strength of the electric field to be formed is not damaged by the removing of the gate insulating film 5 and the passivation film 11 on the pixel electrode 3 and the counter electrode 4 in a region where the electric field in the direction parallel to the substrate 1 face is formed.

Embodiment 6

Figure 10:
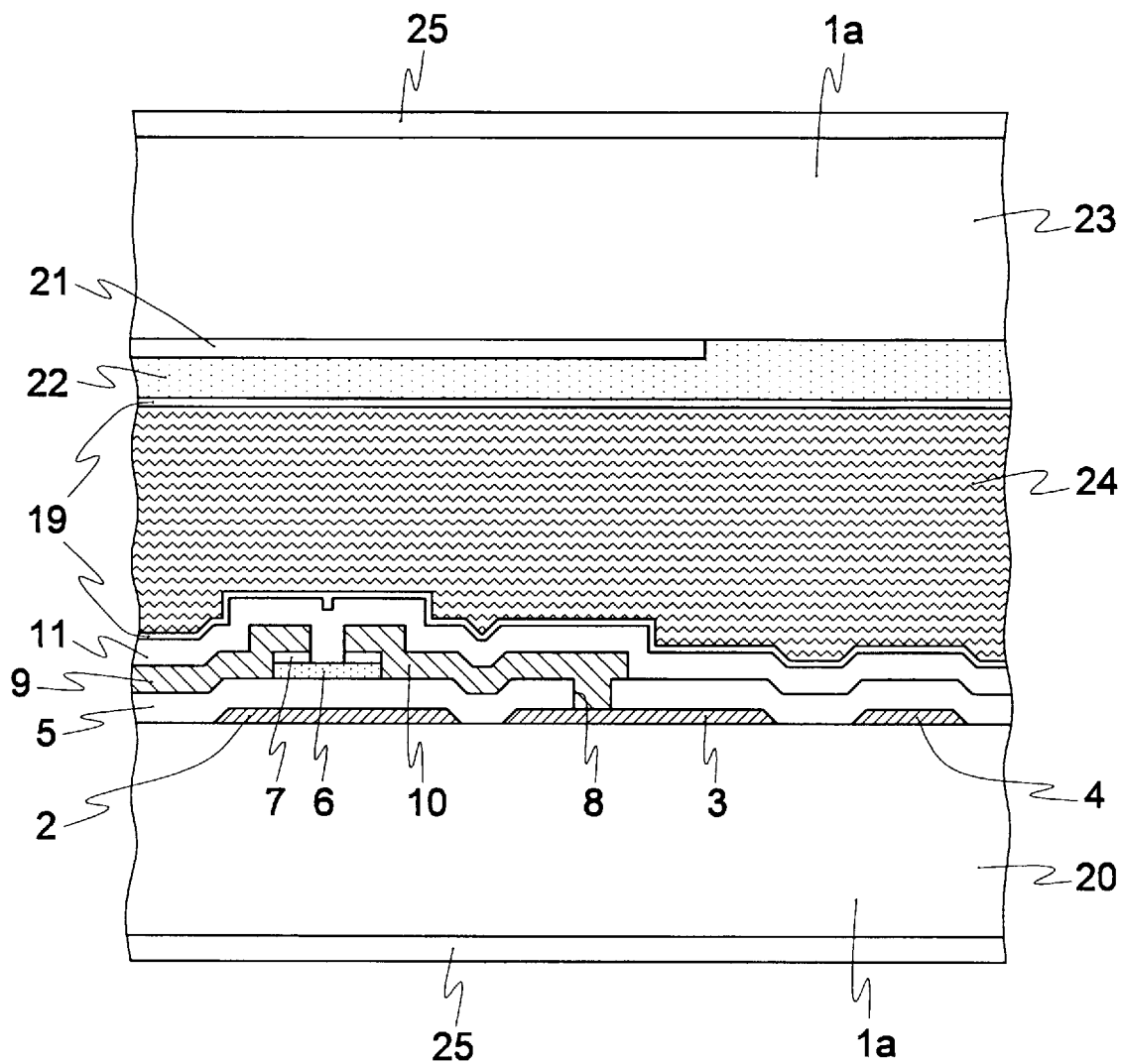
FIG. 10 is a sectional view showing the liquid crystal panel of the liquid crystal display of the invention.
Figure 11:
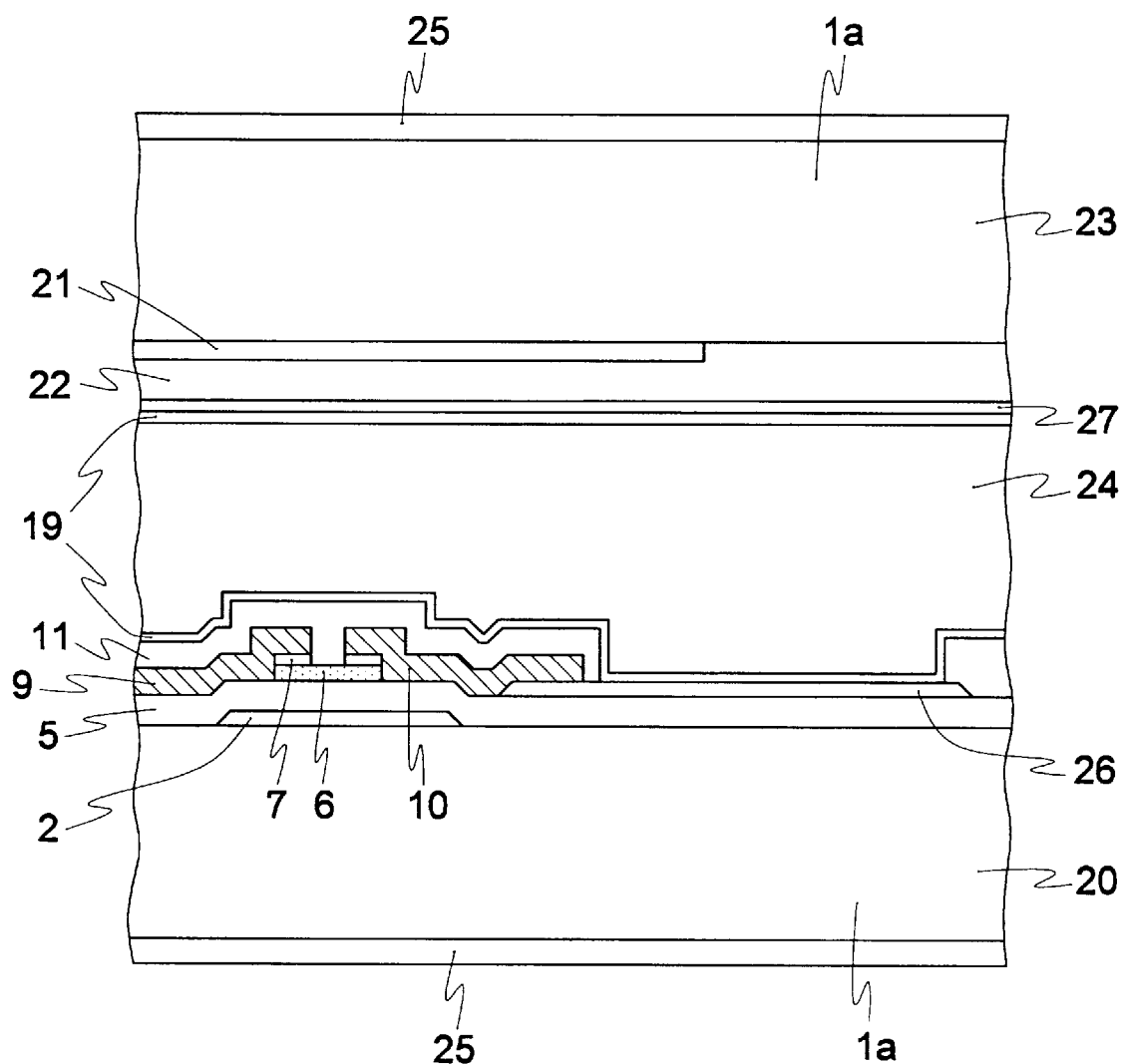
FIG. 11 is a sectional view of the liquid crystal panel of the conventional liquid crystal display.

FIG. 10 is a sectional view showing the liquid crystal panel of the liquid crystal display with the TFT-array of the present invention being mounted on it. Referring to the drawing, reference numeral 1a is a transparent insulating substrate such as glass substrate or the like. Reference numeral 19 is an alignment film. Reference numeral 20 is a TFT substrate. Reference numeral 21 is a black matrix. Reference numeral 22 is an overcoat layer. Reference numeral 23 is an opposite substrate. Reference numeral 24 is a liquid crystal. Reference numeral 25 is a polarization plate. The same parts in FIG. 10 are designated with the same reference numerals in FIG. 1 with no description of the same parts being given.

The alignment film 19 is entirely formed to construct the TFT substrate 20 after the formation of the TFT-array on the transparent insulating substrate 1a by the same method of Embodiment 1 through Embodiment 5. The black matrix 21 for shielding the light which causes the inferior display, the overcoat layer 22, the alignment film 19 are sequentially formed on the other transparent insulating substrate 1a to construct the opposite substrate 23. The TFT substrate 20 and the opposite substrate 23 formed in this manner are opposed to each other to construct the liquid crystal panel by the impregnating of the liquid crystal 24 between them and the pasting of the polarization plate 25 on the outside of both the substrates.

The present embodiment can provide the liquid crystal display, which is hardly lowered in contrast when the visual angle direction has been changed, is hardly inverted in the gradation level when the multi-gradation has been displayed, is even in display and is high in aperture ratio because of the adoption of a system where the direction of the electric field for applying upon the liquid crystal 24 is made parallel to the substrate face by the mounting of the TFT-array which is equal within the substrate in strength of the electric field in the direction parallel to the transparent insulating substrate 1a face, and is small in the area of the line and the electrode portion.

As described above, the present invention can provide a TFT-array which is equal within the substrate in strength of the electric field in a direction parallel to the substrate face and is smaller in the area of the line at the electrode portion, because the electrode can be formed finer with high-accuracy for forming the electric field in the direction parallel to the substrate face.

Also, the present embodiment can provide the liquid crystal display, which is hardly lowered in contrast when the visual angle direction has been changed, and is hardly inverted in the gradation level when the multi-gradation has been displayed, is even in displaying, and is higher in aperture ratio because of the adoption of a system where the direction of the electric field for applying upon the liquid crystal is made parallel in direction to the substrate face by the mounting of the TFT-array which is equal within the substrate in strength of the electric field in the direction parallel to the transparent insulating substrate face, and is smaller in the area of the line and the electrode portion.

While only certain presently preferred embodiments of the invention have been described in detail, as will be apparent with those familiar with the art, certain changes and modifications can be made without departing from the spirit and scope of the invention as defined by the following claims.

What is claimed is:

1. A TFT-array comprising a substrate, gate electrode, a first and second electrode provided on the substrate simultaneously with the gate electrode, an insulating film formed on the gate electrode, the first and the second electrode, a semiconductor layer formed on the gate electrode in such a manner that the insulating film is interposed between the semiconductor layer and the gate electrode, a pair of electrodes, either of which is connected with the first electrode or the second electrode, said pair of electrodes defining a semiconductor element together with the semiconductor layer.

2. The TFT-array of claim 1, wherein the first electrode and the second electrode are arranged so that they are comb-shaped respectively and are opposed to each other.

3. The TFR-array of claim 1, wherein one line for forming a storage capacitance on the gate electrode side, and another line for applying the voltage upon the first electrode or the second electrode on the opposite side to the one line are formed in such a manner that the regions forming the electric field in a direction parallel to the substrate is interposed between the one line and the another line.

4. The TFT-array of claim 3, wherein the line for forming the storage capacitance and the line for applying the voltage upon the first electrode or the second electrode is electrically connected to at least one first electrode or second electrode.

5. The TFT-array of claim 1, wherein the low resisting material is connected with at least either of the line for applying the voltage upon the gate electrode, the first electrode or the second electrode or the line for forming the storage capacitance.

6. The TFT-array of claim 1, wherein whole part of the insulating film or a part of the insulating film is removed the insulating film being formed on the region for forming the electric field in the direction parallel to the substrate face.

* * * * *